US012763736B1

(12) United States Patent
Agrawal et al.

(10) Patent No.: US 12,763,736 B1
(45) Date of Patent: Oct. 13, 2026

(54) ANALOG REFERENCES FOR HIGH VOLTAGE INPUT-OUTPUT WITH IMPROVED BIAS CURRENT

(71) Applicant: Synopsys, Inc., Sunnyvale, CA (US)

(72) Inventors: Ankit Agrawal, Uttar Pradesh (IN); Deep Shekhar, Uttar Pradesh (IN); Harsh Sahay, Uttar Pradesh (IN); Satyam Singh, Uttar Pradesh (IN)

(73) Assignee: Synopsys, Inc., Sunnyvale, CA (US)

( * ) Notice: Subject to any disclaimer, the term of this patent is extended or adjusted under 35 U.S.C. 154(b) by 322 days.

(21) Appl. No.: 18/582,626

(22) Filed: Feb. 20, 2024

(51) Int. Cl.
*H03F 3/04* (2006.01)
*H03F 1/52* (2006.01)

(52) U.S. Cl.
CPC ................ *H03F 3/04* (2013.01); *H03F 1/52* (2013.01); *H03F 2200/426* (2013.01)

(58) Field of Classification Search
CPC ......... H03F 3/04; H03F 1/52; H03F 2200/426
See application file for complete search history.

(56) References Cited

U.S. PATENT DOCUMENTS

| | | | | | |
|---|---|---|---|---|---|
| 5,691,605 | A * | 11/1997 | Xia | H05B 41/2855 315/293 |
| 5,872,429 | A * | 2/1999 | Xia | H05B 41/3921 315/DIG. 4 |
| 2008/0104435 | A1 * | 5/2008 | Pernia | G06F 1/3203 713/322 |
| 2012/0319588 | A1 * | 12/2012 | Sid | H05B 41/2851 315/129 |
| 2016/0112662 | A1 * | 4/2016 | Guillon | H04N 25/771 348/294 |
| 2020/0313383 | A1 * | 10/2020 | Petrulionis | G02F 1/0327 |
| 2024/0396505 | A1 * | 11/2024 | Kaur | H03G 3/30 |

FOREIGN PATENT DOCUMENTS

CN 102544001 A * 7/2012

* cited by examiner

*Primary Examiner* — Adam D Houston

(57) ABSTRACT

An apparatus may include an amplifier loop to generate a first bias voltage, and a first outer ballast stage having a first transistor chain, where an output of the amplifier loop is connected to a first gate of a first transistor of the first outer ballast stage, and a second gate of a second transistor of the first outer ballast stage is connected to a first control signal to enable and disable the first outer ballast stage. The apparatus may further include a second outer ballast stage having a second transistor chain, where a bias current on a reference voltage output rail driven by at least the first and second outer ballast stages is based upon a number of outer ballast stages that are enabled.

20 Claims, 6 Drawing Sheets

310

| IO Configuration | Bias Current in Conventional Approach (uA) | Bias Current in New Approach (uA) | | | Bias Current Reduction |
|---|---|---|---|---|---|
| | | Reference Generator Bias current | GPIO Bias Current | Total Bias Current | |
| Standby/Static configuration | 160 | 48 | 0 | 48 | 70 % |
| Transmitter mode in highest drive mode (16mA) with toggling input | 160 | 48 | 16.5 | 64.5 | 69 % |
| Transmitter mode in lowest drive mode (2mA) with toggling input | 160 | 48 | 2.4 | 50.4 | 60 % |

320

| IOs Configuration | Bias Current in Conventional Approach | | Bias Current in New Approach (uA) | | | | Bias Current Reduction |
|---|---|---|---|---|---|---|---|
| | No of reference generation IPs required in IO ring | Total bias current (uA) | No of reference generation IPs required in IO ring | Bias current for IO ring (uA) | | Total bias current (uA) | |
| | | | | Current consumption of reference generator | Additional current in IOs for distributed bias | | |
| Standby/Static configuration | 1 | 160 | 1 | 48 | 0 | 48 | 70 % |
| Transmitter mode in highest drive mode (16mA) with toggling input | 2 | 320 | 1 | 48 | 165 | 213 | 33 % |
| Transmitter mode in lowest drive mode (2mA) with toggling input | 1 | 160 | 1 | 48 | 24 | 72 | 55 % |

FIG. 3

ANALOG REFERENCES FOR HIGH VOLTAGE INPUT-OUTPUT WITH IMPROVED BIAS CURRENT

TECHNICAL FIELD

The present disclosure relates to integrated circuit input-output ports, and more particularly to generating and delivering reference voltages with selected bias currents to input-output ports.

BACKGROUND

High voltage supply input-output ports of integrated circuits may utilize reference voltages for reliability and to protect from electrical over-stress, which may be supported by reference voltage generator blocks. High load/frequency requirements of programmable drivers can be supported by higher drive strength. In addition, some input-output ports may be configured to work in different mode of operation, such as: standby mode, transmit mode, receive mode, static mode, toggling mode, and so forth. Depending on the input-output port(s) configuration(s) and utilization scenarios, electrical current demands from a reference voltage generator block may vary. However, current centralized reference generation schemes may provide an electrical current as if all input-output ports are toggling in a highest transmit drive mode. In other words, the current for the reference voltage is provided assuming a maximum demand from the supported input-output ports at all times. As such, the current may often be higher than necessary based upon the actual utilizations of the various input-output ports.

BRIEF DESCRIPTION OF THE DRAWINGS

The present disclosure will be understood more fully from the detailed description given below and from the accompanying figures of embodiments of the present disclosure. The figures are used to provide knowledge and understanding of embodiments of the present disclosure and do not limit the scope of the present disclosure to these specific embodiments. Furthermore, the figures are not necessarily drawn to scale.

FIG. 3 illustrates a first table illustrating bias current reduction for a single input-output port and a second table illustrating bias current reduction for multiple input-output ports using an input-output reference voltage generator circuit of the present disclosure.

DETAILED DESCRIPTION

Figure 1:
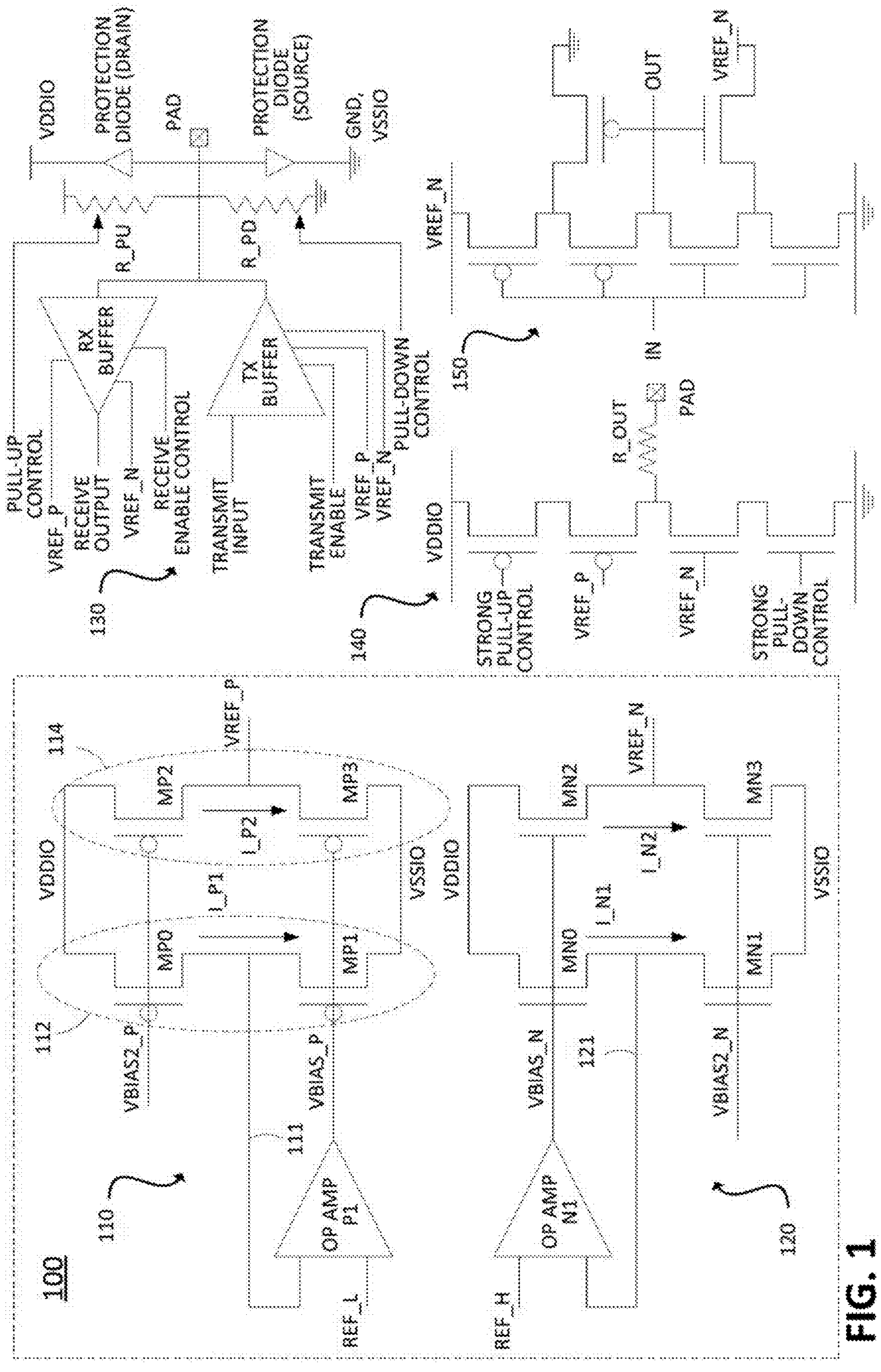
FIG. 1 illustrates an example of an input-output reference voltage generator circuit, or circuits, an example transmit-receive circuitry for an input-output port, an additional example receive circuitry for an input-output port, and an additional example transmit circuitry for an input-output port.

Aspects of the present disclosure relate to generating and delivering reference voltages for integrated circuit input-output ports. High voltage supply input-output ports of integrated circuits may utilize reference voltages for reliability and to protect from electrical over-stress, which may be supported by reference voltage generator blocks. High load/frequency requirements of programmable drivers can be supported by higher drive strength. In addition, some input-output ports may be configured to work in different modes of operation, such as: standby mode, transmit mode, receive mode, static mode, toggling mode, and so forth. Depending on the input-output port(s) configuration and utilization scenarios, electrical current demands from a reference voltage generator block, also referred to as an input-output voltage regulator, may vary. Certain centralized reference generation schemes may provide an electrical current as if all input-output ports are toggling in a highest transmit drive mode. In other words, the current for the reference voltage is provided assuming a maximum demand from the supported input-output ports at all times. For example, if a circuit includes six input-output ports, the reference voltage bias current may be set as if all six input-output ports are toggling in a highest transmit drive mode. As such, the bias current may often be higher than necessary based upon the actual utilizations of the various input-output ports.

To further illustrate, in an existing reference voltage generator design, analog buffers and a final ballast stage may remain inside/internal to the regulator. In a typical arrangement, the final ballast stage may be pumped with 10 times or more current than an inner ballast stage/pre-final stage for sufficient load regulation. Notably, this high bias current may continue to flow, even when input-output ports are running in low drive conditions or even in static conditions. This may generally result in overconsumption of electrical power beyond what is sufficient for the actual input and/or output loads.

In contrast, examples of the present disclosure provide an advanced design for input-output reference voltage bias current distribution that improves or optimizes the total bias current associated with reference voltages for input-output ports (e.g., in an input-output ring of an integrated circuit (IC)/system-on-chip (SoC)) based on the configuration of such input-output ports. In addition, examples of the present disclosure may provide dynamic, adjustable bias current for input-output reference voltages with little or no increase in area for a reference voltage generator module (e.g., a circuit, or sub-circuit within an IC/SoC). Examples of the present disclosure may also be used across various input-output bus/interface types, including: general-purpose input-output (GPIO), inter-integrated circuit (I2C), improved inter-integrated circuit (I3C), secure digital input-output (SDIO), serial peripheral interface (SPI), and so forth.

Technical advantages of the present disclosure include, but are not limited to reduced bias current, and hence reduced power consumption associated with input-output reference voltages, as well as the ability to dynamically adjust the bias current in response to the utilizations/states of the input-output pins, including the ability to support multiple drive modes for one or more input-output pins. In addition, the present examples may achieve these performance advantages without any area penalty. Examples of the present disclosure also provide an improved computing device or system implementing various aspects described herein. For instance, a computing device including an IC/SoC of the present disclosure may consume substantially less power over the life of the IC due to the ability to reduce the bias current for input-output analog reference voltages based upon the particular input-output port configurations and utilizations. These and other aspects of the present disclosure are discussed in greater detail below in connection with the examples of FIGS. 1-6.

FIG. 1 illustrates an example of an input-output (I/O) reference voltage generator circuit 100, an example transmit-receive circuitry 130 for an input-output port, an additional example transmit circuitry 140 for an input-output port, and an additional example receive circuitry 150 for an input-output port. For instance, the I/O reference voltage generator circuit 100 may include a first circuit 110 (e.g., a first sub-circuit) for generating a first reference voltage (VREF_P) and a second circuit 120 (e.g., a second sub-circuit) for generating a second reference voltage (VREF_N).

To further illustrate, the first circuit 110 may include an amplifier loop stage 111, which may include operational amplifier (op amp) P1, and a p-type transistor MP1 (e.g., a p-type metal-oxide-semiconductor (PMOS) transistor, or the like). As illustrated in FIG. 1, op amp P1 includes two inputs, one including feedback from the amplifier loop stage 111, and the other including a reference input REF_L (where REF_L may be generated by an external mechanism). The first circuit 110 may also include an inner ballast stage 112 which may include transistors MP0 and MP1 (e.g., a transistor chain), each of which may include p-type transistors. For instance, the transistor chain/inner ballast stage 112 may provide a current path between an input-output positive supply voltage rail (VDDIO) and an input-output negative supply voltage rail (VSSIO). The gate of transistor MP1 is controlled by the output of op amp P1, which is labeled as VBIAS_P. The gate of transistor MP0 is controlled by a signal labeled as VBIAS2_P. In one example, VBIAS2_P may be generated by an external mechanism. In one example, VBIAS2_P may have a fixed voltage. The feedback for amplifier loop 111 may include an intermediate point in the transistor chain/inner ballast stage 112 between transistors MP0 and MP1. As illustrated in FIG. 1, the first circuit 110 further includes a final ballast stage 114 (e.g., a second transistor chain) which includes p-type transistors MP2 and MP3. Similar to the inner ballast stage 112, the gates of MP2 and MP3 are controlled by VBIAS2_P and VBIAS_P, respectively. However, the sizing of MP2 and MP3 may be selected such that the current I_P2 is substantially larger than I_P1, e.g., 5 times larger, 10 times larger, or the like. The output of the first circuit 110 is a first reference voltage VREF_P.

As noted above, I/O reference voltage generator circuit 100 further includes a second circuit 120 (e.g., a second sub-circuit). Notably, the second circuit 120 may have similarities to the first circuit 110, but may include n-type transistors MN0-MN3 (e.g., n-type metal-oxide-semiconductor (NMOS) transistors, or the like). To further illustrate, the second circuit 120 may include op amp N1 with a first input REF_H and a second input for feedback from amplifier loop 121. Similarly to the above, REF_H may be generated by an external mechanism. The second circuit 120 may also include an inner ballast stage, which may include transistors MN0 and MN1 (e.g., a transistor chain), providing a current path between the input-output positive supply voltage rail (VDDIO) and the input-output negative supply voltage rail (VSSIO). The gate of transistor MN0 is controlled by the output of op amp N1, which is labeled as VBIAS_N. The gate of transistor MN1 is controlled by a signal labeled as VBIAS2_N. In one example, VBIAS2_N may be generated by an external mechanism. In one example, VBIAS2_N may have a fixed voltage. The feedback for amplifier loop 121 may include an intermediate point in the transistor chain/inner ballast stage between transistors MN0 and MN1. As illustrated in FIG. 1, the second circuit 120 further includes a final ballast stage (e.g., a second transistor chain) which includes transistors MN2 and MN3. Similar to the inner ballast stage (including MN0 and MN1), the gates of MN2 and MN3 are controlled by VBIAS_N and VBIAS2_N, respectively. However, the sizing of MN2 and MN3 may be selected such that the current I_N2 is substantially larger than I_N1, e.g., 5 times larger, 10 times larger, or the like. The output of the second circuit 120 is a second reference voltage VREF_N.

Notably, the first and second reference voltages, VREF_P and VREF_N, may be used as reference voltages, e.g., for transmit-receive circuitry 130 for an input-output port of an IC/SoC. It should be noted that VREF_P and VREF_N may be similarly used in connection with multiple I/O ports, e.g., in an I/O ring, or the like, also referred to herein as an I/O stage. To further illustrate, transmit-receive circuitry 130 may include a receive stage, e.g., including a receive/input buffer (RX buffer) having a receive output, a receive enable control signal, and inputs VREF_N and VREF_P. Transmit-receive circuitry 130 may also include a transmit stage, e.g., including a transmit/output buffer (TX buffer) having a transmit input, a transmit enable control signal, and inputs VREF_P and VREF_N. The output of the TX buffer and the input of the RX buffer may be connected to an input/output pad (PAD) as illustrated in FIG. 1. In addition, the transmit-receive circuitry 130 may include a pull-up resistor R_PU, with a pull-up control input, and a pull-down resistor R_PD, with a pull-down control input, and protection diodes connected to source voltage (VSSIO) or ground, and to VDDIO, respectively. For instance, the protection diodes may be to protect the input-output port associated with the pad from electrostatic discharge (ESD), or the like.

FIG. 1 further illustrates transmit circuitry 140, which in one example may be part of the TX buffer of transmit-receive circuitry 130. For instance, transmit circuitry 140 may be a transmit driver including a transistor chain as shown (e.g., two p-type transistors and two n-type transistors, illustrated using similar symbols as in the preceding examples) providing a current path between VDDIO and ground/VSSIO. For example, transmit circuitry 140 may be included in the TX buffer for stress limit relief. The gates of the transistors are controlled as shown using VREF_P and VREF_N, as well as strong pull-up control and strong pull-down control signals, which may be derived from the core input(s). In such an example, the transmit circuitry 140 may further include an output resistor R_OUT connected to the I/O pad and to an intermediate point in the transistor chain as shown in FIG. 1.

FIG. 1 still further illustrates receive circuitry 150 for an input-output port. For instance, receive circuitry 150 may illustrate a Schmitt trigger including and input port (IN), and output port (OUT), and six transistors arranged as shown (e.g., three p-type and three n-type transistors). Notably, in the present example, VREF_N is used as a drain voltage (where VREF_P is not used in this particular configuration of receive circuitry 150). In one example, the receive circuitry 150 may be part of the RX buffer of transmit-receive circuitry 130.

It should be noted that in the arrangement of I/O reference voltage generator circuit 100, and of sub-circuits 110 and 120 thereof, the currents I_P2 and I_N2 may be at a highest level that may be desirable based upon a highest transmit drive mode of one or more input-output ports, e.g., in an I/O ring that utilizes I/O reference voltages VREF_P and VREF_N. For instance, VREF_P may be used in connection with multiple I/O ports configured as transmit ports and operating in a highest drive mode. For example, for transmit operation, an I/O port may operate in drive modes ranging from a minimum of 2 mA up to a maximum of 16 mA. In addition, there may be six I/O ports that may all be supported by the same I/O reference voltage generator circuit 100. Where each is operating in the highest drive mode, the total transmit drive load may be 96 mA. Correspondingly, this may call for a bias current of 160 uA. As such, I/O reference voltage generator circuit 100 may be configured such that I_P2 and I_N2 are always at or around 160 uA (or more).

Figure 2:
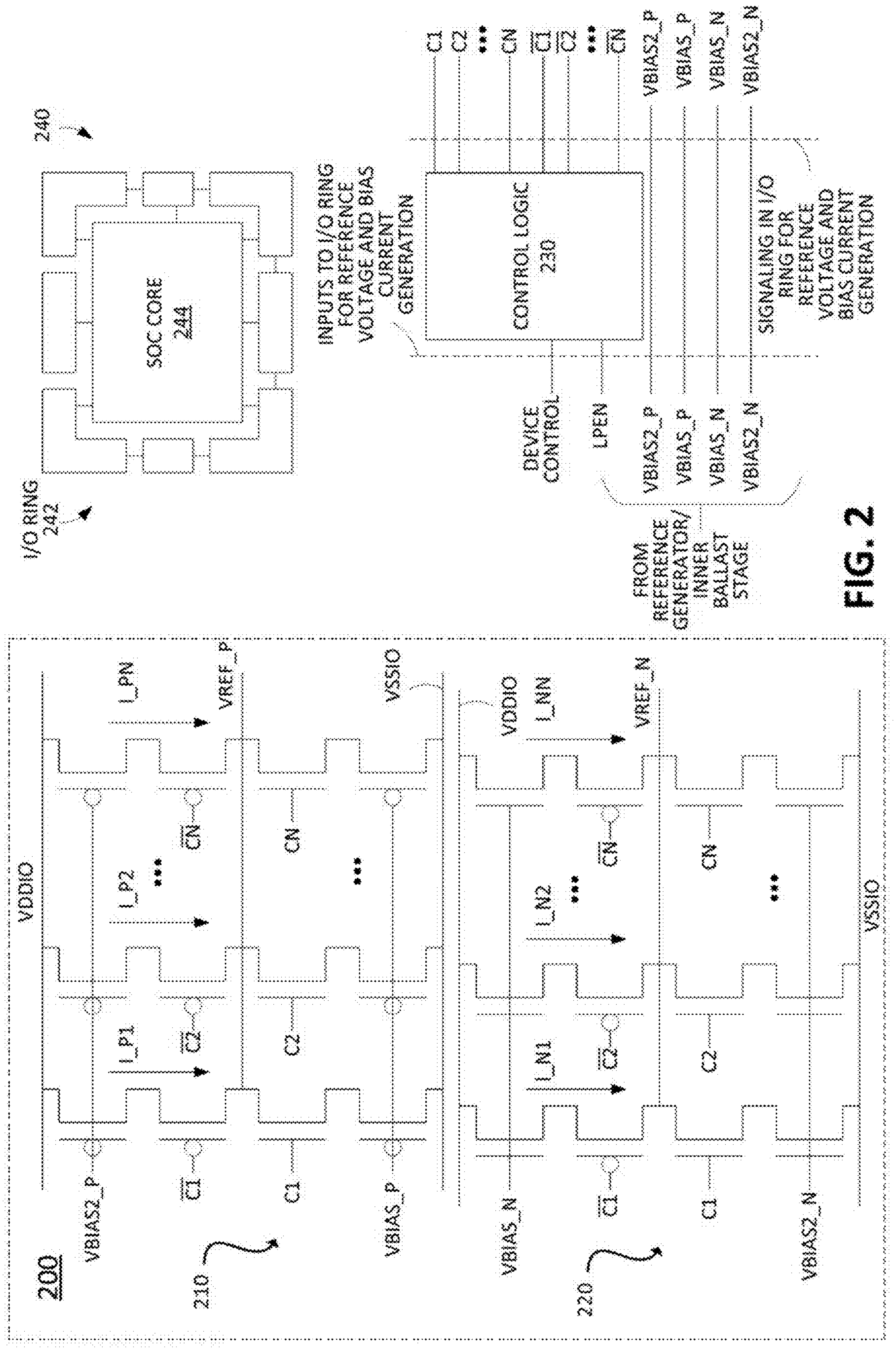
FIG. 2 illustrates an example system-on-chip/integrated circuit with an input-output ring, an example reference voltage generator circuit, or circuits, with configurable bias current(s), and an example control sub-circuit, in accordance with the present disclosure.

FIG. 2 illustrates an example SoC/IC 240 with an input-output ring 242, an example I/O reference voltage generator circuit 200 (including circuits/sub-circuits 210 and 220), with configurable bias current(s), and an example control sub-circuit, control logic 230, in accordance with the present disclosure. In particular, the SoC/IC 240 may include SoC core 244 and I/O ring 242 surrounding SoC core 244. The SoC core 244 may incorporate the primary logic for which the SoC/IC 240 is designed, while the I/O ring 242 may include I/O pads/ports for connection of SoC/IC 240 to external entities, e.g., via one more I/O busses, as well as isolation and protection of the SoC core 244 from high voltages external to SoC core 244. For instance, this may include electrostatic discharge (ESD) as well as over-voltages/under-voltages on the I/O pads, e.g., from external signals received via the one or more I/O busses, which may include glitch and/or desired signals that may include overshoots and/or undershoots with respect to one or more intended signal voltage levels. In addition, with smaller and smaller chips associated with advanced process technologies (e.g., 3 nm process, 2 nm process, etc.), the internal voltages such as what may be used for SoC core 244 may increasingly diverge from (and may be substantially less than) the voltages that may be used to convey signals on I/O busses externally. As such, I/O rings, such as I/O ring 242, may utilize reference voltages, e.g., from an I/O reference voltage generator circuit, such as I/O reference voltage generator circuit 100 of FIG. 1 or I/O reference voltage generator circuit 200 of FIG. 2. In this regard, it should also be noted that an I/O ring, such as I/O ring 242 may include transmit-receive circuitry, such as transmit-receive circuitry 130 of FIG. 1. For instance, I/O ring 242 may include a number of I/O ports, N, and may therefore include N instances of transmit-receive circuitry.

In the present example of FIG. 2, I/O reference voltage generator circuit 200 includes a first circuit 210 (e.g., a first sub-circuit) and a second circuit 220 (e.g., a second sub-circuit), each of which is capable of generating a respective reference voltage as output (e.g., VREF_P and VREF_N) with a configurable bias current. It should be noted that VREF_P and VREF_N as illustrated in FIG. 2 may be used in the same or similar manner as illustrated and described in connection with the example of FIG. 1. To further illustrate, the first circuit 210 includes a number of final ballast stages, N, where each final ballast stage may include a transistor chain providing a current path between an input-output positive supply voltage rail (VDDIO) and an input-output negative supply voltage rail (VSSIO) as illustrated (e.g., a chain of two p-type transistors (e.g., PMOS), an n-type transistor (e.g., NMOS), and an additional p-type transistor). The gates of the first and last p-type transistors in each ballast stage/transistor chain are controlled by VBIAS2_P and VBIAS_P, respectively. It should be noted that VBIAS2_P and VBIAS_P may include the same or similar signal as described above and as illustrated in the example of FIG. 1. In this regard, it should be noted that the circuit 210 may be distributed from the amplifier loop and inner ballast stage (and in one example, may further be distributed throughout an I/O ring). For instance, this example may be as illustrated in FIG. 2. However, in another example, the circuit 210 may be co-located with and/or may further include an amplifier loop and inner ballast stage such as illustrated in FIG. 1. It should also be noted that although examples are described herein primarily in connection with complementary metal-oxide-semiconductor (CMOS) circuits including PMOS and NMOS transistors, in other, further, and different examples, other similar transistor types may be used, such as PNP bipolar junction transistors, NPN bipolar junction transistors, tunnel field-effect transistors (TFETs), heterojunction TFETs, fin field-effect transistors (FinFETs), and so forth.

In a distributed design, such as the example of FIG. 2, in one example, four additional rails may be contained in an I/O ring (e.g., as compared to a design that may use a conventional I/O reference voltage generator/regulator circuit). For instance, an I/O ring may further include rails for VBIAS_P, VBIAS2_P, VBIAS_N, and VBIAS2_N. Referring again to the first circuit 210, the gates of the inner p-type transistor and inner n-type transistor are controlled by respective control signals C1-CN and $\overline{\mathbf{C1}\text{-}\mathrm{CN}}$, e.g., from a control logic/circuit, such as control logic 230. For instance, the unmodified control signals C1-CN may be used to control respective NMOS gates, while the logical inversions thereof $\overline{\mathbf{C1}\text{-}\mathrm{CN}}$ may be used to control respective PMOS gates as illustrated. In addition, VBIAS2_P and VBIAS_P may provide for a minimum static current to be present in each of the transistor chains/final ballast stages. Thus, when a control signal, such as C1, is at a level corresponding to a logic high, the associated transistor chain/ballast stage may be activated/turned on, providing a path for current I_P1 to flow, and hence contributing to a bias current for the reference voltage VREF_P. Similarly, when an additional control signal, such as C2 is at a level corresponding to a logic high, the associated transistor chain/ballast stage may be activated/turned on, providing a path for current I_P2 to flow and hence contributing to the bias current for the reference voltage VREF_P, and so forth for any of the other final ballast stages/transistor chains of the first circuit 210. Conversely, if a control signal is at a level corresponding to a logic low, the associated final ballast stages/transistor chains may be turned off/deactivated, and thus may not contribute to the cumulative bias current for VREF_P.

To illustrate, in one example, an I/O ring may have six I/O ports, each is configured to operate in the highest drive mode of 16 mA. In one example, circuit 210 may be configured to include six transistor chains/branches/final ballast stages, one for each I/O port, each of which may be configured to deliver 16.5 uA when activated. Thus, if all six I/O ports are toggling in the highest drive mode, then all six transistor chains/branches/final ballast stages may be activated via the respective control signals C1, C2, etc. However, if only four I/O ports are toggling in the highest drive mode, then only four transistor chains/branches/final ballast stages may be activated, while the others are deactivated/remain inactive via the respective control signals. A similar manner of configuration and operation may likewise be applied to the second circuit 220 as described in greater detail below.

Alternatively, or in addition, each I/O port may have multiple final ballast stages/branches that may be activated and deactivated for fine tuning on the port. For instance, circuit 210 may be specific to a single I/O port. In other words, each I/O port may have its own instance of circuit 210. As such, an I/O ring may be include instances of circuit 210 distributed with respective I/O ports. In addition, each I/O port may have its own set of control signals, C1, C2, . . . , CN. For instance, C1, C2, . . . , CN may be control signals generated within an I/O port, e.g., by control logic 230, in response to a detected drive mode of that particular port. However, VREF_P and VREF_N may remain distributed on respective busses running throughout the I/O ring. A similar manner of configuration and operation may likewise be applied to the second circuit 220 as described in greater detail below.

In particular, the second circuit 220 (e.g., a second sub-circuit) may have a similar configuration and similar operation as the first circuit 210; however, primarily using n-type transistors. For example, the second circuit 210 includes a number of final ballast stages, N, where each final ballast stage may include a transistor chain providing a current path between an input-output positive supply voltage rail (VDDIO) and an input-output negative supply voltage rail (VSSIO) as illustrated (e.g., a chain of a first n-type transistor (e.g., NMOS), a p-type transistor (e.g., PMOS), and an additional two n-type transistors). The gates of the first and last n-type transistors in each final ballast stage/transistor chain are controlled by VBIAS_N and VBIAS2_N, respectively. It should be noted that VBIAS_N and VBIAS2_N may include the same or similar signals as described above and as illustrated in the example of FIG. 1. In this regard, it should be noted that the circuit 220 may be distributed from the amplifier loop and inner ballast stage (and in one example, may further be distributed throughout an I/O ring). For instance, this example may be as illustrated in FIG. 2. However, in another example, the circuit 220 may co-located with and/or may further include an amplifier loop and inner ballast stage such as illustrated in FIG. 1.

In each final ballast stage/transistor chain, the gates of the inner n-type transistor and inner p-type transistor are controlled by respective control signals C1-CN and $\overline{C1}$-$\overline{CN}$. For instance, the unmodified control signals C1-CN may be used to control respective NMOS gates, while the logical inversions thereof $\overline{C1}$-$\overline{CN}$ may be used to control respective PMOS gates as illustrated. In addition, VBIAS_N and VBIAS2_N may provide for a minimum static current to be present in each of the transistor chains/final ballast stages. Thus, when a control signal, such as C1, is at a level corresponding to a logic high, the associated transistor chain/ballast stage may be activated/turned on, providing a path for current I_N1 to flow and hence contributing to a bias current for the reference voltage VREF_N. Similarly, when an additional control signal, such as C2 is at a level corresponding to a logic high, the associated transistor chain/ballast stage may be activated/turned on, providing a path for current I_N2 to flow and hence contributing to the bias current for the reference voltage VREF_N, and so forth for any of the other final ballast stages/transistor chains of the second circuit 220. Conversely, if a control signal is at a level corresponding to a logic low, the associated final ballast stages/transistor chains may be turned off/deactivated, and thus may not contribute to the cumulative bias current for VREF_N.

In one example, the control signals for C1, C2, . . . , CN (and $\overline{C1}$, $\overline{C2}$, $\overline{CN}$) may be generated via a control logic/circuit 230. For instance, an additional core pin, which may be referred to as a low power enable (LPEN) pin, may be added to indicate whether an input/output port is toggling or static. In addition, control signals may be generated by the control logic 230 inside the I/O port and may use I/O pin configuration information, along with I/O pin/port toggling information, to enable the requisite bias current, e.g., by selecting a number of and/or which final ballast stages/branches/transistor chains to make active and/or inactive.

It should be noted that FIG. 2 illustrates just one example of an I/O reference voltage generator circuit 200, and that other, further, and different example I/O reference voltage generator circuits may be implemented in accordance with the present disclosure. As just one example, the branches/final ballast stages/transistor chains in the first circuit 210 may all have the same size transistors, and similarly for the second circuit 220. Thus, each branch/final ballast stage/transistor chain may deliver the same component currents when activated. However, in another example, one or more transistors in one or more of the branches/final ballast stages/transistor chains may have a different size relative to a corresponding transistor(s) in one or more others of the final ballast stages/transistor chains. As such, different final ballast stages/transistor chains may deliver different component currents to the overall bias currents that will be exhibited for VREF_P and VREF_N, respectively. In one example, the number of final ballast stages/transistor chains may be more or less than the number of I/O ports to provide a coarser ability to adapt to demand or a more fine-grained approach. In still another example, the inner transistors with gates controlled by the respective control signals C1, C2, . . . , CN may have a different configuration, such as swapping the p-type and n-type transistors and using inverters, using logic low to activate the respective branches, e.g., instead of logic high, and so forth. Thus, these and other modifications are all contemplated within the scope of the present disclosure.

FIG. 3 illustrates a first table 310 demonstrating bias current reduction for a single I/O port and a second table 320 demonstrating bias current reduction for multiple I/O ports using an I/O reference voltage generator circuit of the present disclosure. In particular, table 310 illustrates that in a conventional approach (such as the example of FIG. 1) a fixed bias current of 160 uA may be used for a single I/O port of an I/O ring, regardless of whether the single I/O port is in static/standby mode or is toggling, and regardless of whether the single I/O port is operating in a highest drive mode of 16 mA or a lowest drive mode of 2 mA. In contrast, an example in accordance with the present disclosure (such as the example of FIG. 2) may exhibit a baseline of 48 uA bias current from a reference generator portion (e.g., an inner ballast stage) and a variable additional bias current of zero in standby/static mode, 2.4 uA in the lowest drive mode of the single I/O port (e.g., 2 mA drive current), and 16.5 uA in the highest drive model of the single I/O port (e.g., 16 mA drive current). The total bias current and corresponding percent reductions in bias current are shown in the last two columns of table 310. Notably, the I/O reference voltage bias current reduction ranges from 60 to 70 percent in this example.

The second table 320 illustrates that in a conventional approach for 10 I/O ports (e.g., in an I/O ring), one or two I/O reference voltage generator circuits may be used. For instance, in the present example, each I/O reference voltage generator circuit may provide an I/O reference voltage with a fixed bias current of 160 uA to support up to six I/O ports toggling in the highest drive mode (e.g., 16 mA for each I/O port). Thus, for example, when all 10 I/O ports are toggling in the highest drive mode, a single I/O reference voltage generator circuit may be insufficient, and a second I/O reference voltage generator circuit may be warranted, resulting in a total bias current of 320 uA (160 uA from each of the two active I/O reference voltage generator circuits). In contrast, in accordance with the present disclosure, a single I/O reference voltage generator circuit may support all 10 I/O ports toggling in the highest drive mode. For instance, the example I/O reference voltage generator circuit 200 of FIG. 2 may provide for twelve branches/transistor chains/ballast stages, each of which may provide 16.5 uA when activated. As in the previous example, a fixed/baseline of 48 uA bias current may be exhibited by a reference generator portion (e.g., an inner ballast stage). Additional variable bias current from zero (static/standby mode) to 165 uA (wherein all ten I/O ports toggling in highest drive mode, and 10 of the 12 branches/transistor chains/final ballast stages activated) may be exhibited. The total bias current and corresponding percent reductions in bias current are shown in the last two columns of table 320. Notably, the I/O reference voltage bias current reduction ranges from 33 to 70 percent in this example. It should also be appreciated that various intermediate reductions in bias current may be obtained for I/O ports operating in drive modes less than the maximum, for fewer active/toggling I/O ports, and so forth. Similarly, in other, further, and different examples, I/O ports and/or I/O rings may utilize higher or lower drive currents than in the example(s) of FIG. 3, a reference generator/inner ballast stage may have a different fixed/baseline bias current, and so forth.

Figure 4:
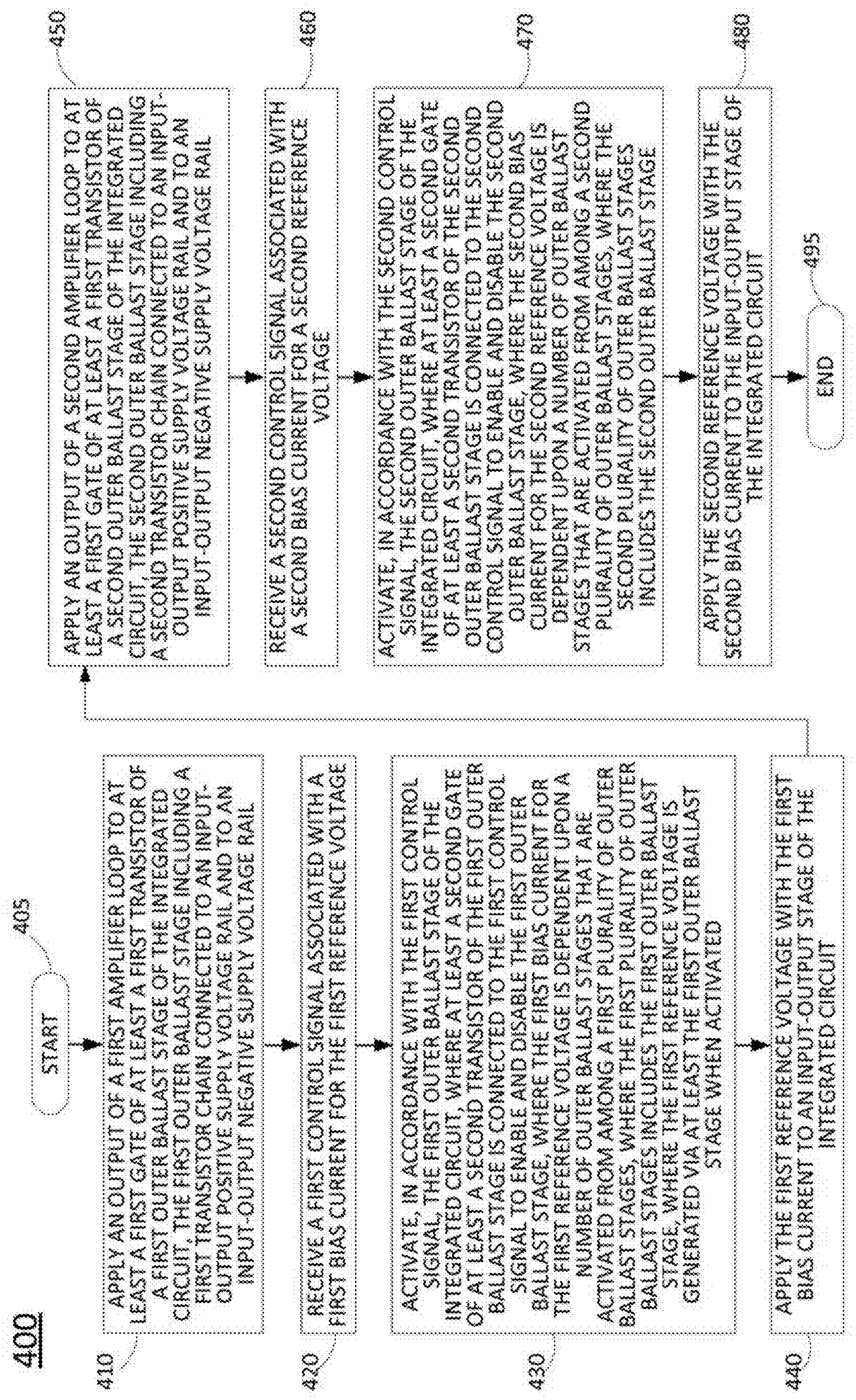
FIG. 4 illustrates a flowchart of an example method for generating and applying a first reference voltage with a first bias current to an input-output stage of an integrated circuit.

FIG. 4 illustrates a flowchart of an example method 400 for generating and applying a first reference voltage with a first bias current to an input-output stage of an integrated circuit. In one example, the method 400 may be performed by a computing device or system, e.g., a processing system, or processing device, including at least one processor, a memory storing instructions, which when executed by the at least one processor, cause the processing system to perform operations, etc. For instance, the method 400 may be performed by a processing system including at least one processor, such as the computer system 600 of FIG. 6, and/or any one or more components thereof, such as processing device 602, or multiple instances of computer system 600 in communication over one or more networks and operating collectively to perform one or more aspects of the method 400. In one example, the method 400 may be performed by a circuit or a portion thereof, e.g., a module, such as an I/O reference voltage generator circuit as described above in connection with FIG. 2 (or at least a portion thereof, such as a first or second sub-circuit as described above), which in one example may also be referred to a processor, or a processing device/system. For illustrative purposes, the method 400 is described in connection with an example performed by a module of an integrated circuit, e.g., an I/O reference voltage generator module. The method 400 begins in 405 and may proceed to 410.

At 410, the module, e.g., of an integrated circuit, may apply an output of a first amplifier loop (e.g., a first bias voltage, such as VBIAS_P or VBIAS_N of FIG. 2) to at least a first gate of at least a first transistor of a first outer ballast stage of the integrated circuit. In one example, the first outer ballast stage may include a first transistor chain connected to an input-output positive supply voltage rail (e.g., VDDIO) and to an input-output negative supply voltage rail (e.g., VSSIO). In one example, the module may be for generating at least a first I/O reference voltage. For instance, the module may include a first or second sub-circuit, such as 210 or 220 of FIG. 2. Thus, in one example, the first transistor chain may include a sequence of a first p-type transistor connected to the input-output positive supply voltage rail, a second p-type transistor connected to the first p-type transistor, an n-type transistor connected to the second p-type transistor, and a third p-type transistor connected to the n-type transistor and to the input-output negative supply voltage rail. In such an example, the at least the first transistor may be the third p-type transistor. In addition, in such an example, a gate of the first p-type transistor may be controlled by a second bias voltage (e.g., VBIAS2_P in FIG. 2).

In another example, the first transistor chain may include a first n-type transistor connected to the input-output positive supply voltage rail, a p-type transistor connected to the first n-type transistor, a second n-type transistor connected to the p-type transistor, and a third n-type transistor connected to the second n-type transistor and to the input-output negative supply voltage rail. In such an example, the at least the first transistor may be the first n-type transistor. In addition, in such an example, a gate of the third n-type transistor may be controlled by a second bias voltage (e.g., VBIAS2_N in FIG. 2). In one example, the first amplifier loop may include a first amplifier having a first input for feedback from a first inner ballast stage including an additional transistor chain and a second input for an input reference voltage.

At 420, the module may receive a first control signal associated with a first bias current for the first reference voltage. For instance, at least the first control signal may be output via a control logic, such as control logic 230 of FIG. 2, that selects the number of outer ballast stages that are activated from among a first plurality of outer ballast stages based upon a number of input-output pins/ports of an input-output stage that are toggling and/or based upon a drive mode of at least one input output port.

At 430, the module may activate, in accordance with the first control signal, the first outer ballast stage of the integrated circuit. For instance, in one example, at least a second gate of at least a second transistor of the first outer ballast stage/first transistor chain may be connected to the first control signal to enable and disable the first outer ballast stage. To illustrate, in an example in which the first transistor chain includes a sequence of a first p-type transistor, a second p-type transistor, an n-type transistor, and a third p-type transistor, the at least the second transistor may include the second p-type transistor and the n-type transistor. In an example in which the first transistor chain includes a sequence of a first n-type transistor, a p-type transistor, a second n-type transistor, and a third n-type transistor, the at least the second transistor may include the p-type transistor and the second n-type transistor. In addition, in one example, the first bias current for the first reference voltage may be dependent upon a number of outer ballast stages that are activated from among a first plurality of outer ballast stages, e.g., where the first plurality of outer ballast stages includes the first outer ballast stage.

At 440, the module may apply the first reference voltage with the first bias current to an input-output stage of the integrated circuit, e.g., at least one input-output port, or an I/O ring including multiple input-output ports (which may also be referred to as an input-output module of the integrated circuit). For example, the at least one input-output port may be for a general-purpose input-output (GPIO) communication bus (which may include a serial general purpose I/O (SGPIO) communication bus, etc.), an inter-integrated circuit (I2C) communication bus (which may alternatively or additionally include two-wire interface (TWI), or the like), an improved inter-integrated circuit (I3C) communication bus, a secure digital input-output (SDIO) communication bus, a serial peripheral interface (SPI) communication bus, and so forth. In one example, the first reference voltage may be set to the input-output voltage load (e.g., the first reference voltage may be set to Vstress when the first reference voltage may be VREF_N). In another example, the first reference voltage may be set to a positive supply voltage, or drain voltage, minus an input-output voltage load ((e.g., the first reference voltage may be set to VDDIO minus Vstress when the first reference voltage may be VREF_P). In one example, the input-output stage may include an input-output port with a Schmitt trigger, where the first reference voltage may be applied as a control input to the Schmitt trigger. In another example, the input-output stage may additionally or alternatively include a transmit driver circuit, where the first reference voltage may be applied as a control input to the transmit driver circuit.

In an example in which the first transistor chain includes a sequence of a first p-type transistor, a second p-type transistor, an n-type transistor, and a third p-type transistor, the applying of the first reference voltage to the input-output stage may be via a first reference voltage output rail connected to the first transistor chain at an intermediate position between the second p-type transistor and the n-type transistor. In an example in which the first transistor chain includes a sequence of a first n-type transistor, a p-type transistor, a second n-type transistor, and a third n-type transistor, the applying of the first reference voltage to the input-output stage may be via a first reference voltage output rail connected to the first transistor chain at an intermediate position between the p-type transistor and the second n-type transistor if the first transistor chain.

At 450, the module may apply an output of a second amplifier loop to at least a first gate of at least a first transistor of a second outer ballast stage of the integrated circuit. In one example, the second outer ballast stage may include a second transistor chain connected to an input-output positive supply voltage rail (e.g., VDDIO) and to an input-output negative supply voltage rail (e.g., VSSIO). In one example, the second amplifier loop may include a second amplifier having a first input for feedback from a second inner ballast stage including an additional transistor chain and a second input for an input reference voltage. For instance, where 410-440 may relate to generating one of VREF_P or VREF_N, 450-480 may relate to generating the other one of VREF_P or VREF_N.

At 460, the module may receive a second control signal associated with a second bias current for a second reference voltage (e.g., VREF_P or VREF_N in the example of FIG. 2). For instance, at least the second control signal may be output via the control logic, such as control logic 230 of FIG. 2, that selects the number of outer ballast stages that are activated from among a second plurality of outer ballast stages based upon a number of input-output pins of the input-output stage that are toggling. In one example, the second control signal may be the same as the first control signal of 420, which may be split and delivered to the respective first outer ballast stage and second outer ballast stage.

At 470, the module may activate, in accordance with the second control signal, the second outer ballast stage of the integrated circuit. For instance, in one example, at least a second gate of at least a second transistor of the second outer ballast stage may be connected to the second control signal to enable and disable the second outer ballast stage. In addition, in one example, the second bias current for the second reference voltage may be dependent upon a number of second outer ballast stages that are activated from among a second plurality of outer ballast stages, where the second plurality of outer ballast stages includes the second outer ballast stage. It should be noted that in an example in which the second transistor chain includes a sequence of a first p-type transistor, a second p-type transistor, an n-type transistor, and a third p-type transistor, the at least the second transistor may include the second p-type transistor and the n-type transistor. In an example in which the second transistor chain includes a sequence of a first n-type transistor, a p-type transistor, a second n-type transistor, and a third n-type transistor, the at least the second transistor may include the p-type transistor and the second n-type transistor.

At 480, the module may apply the second reference voltage with the second bias current to the input-output stage of the integrated circuit. For instance, the second reference voltage may be applied to a transmit and/or receive path of the same or a different I/O port as the first reference voltage applied at 440. For instance, the same or different I/O port may include a Schmitt trigger and/or a transmit driver circuit, where the second reference voltage may be applied as a control input to the Schmitt trigger and/or transmit driver circuit. As noted above, the first reference voltage may be set to one of: an input-output voltage load (e.g., Vstress), or a drain voltage (e.g., a positive supply voltage) minus the input-output voltage load. In one example, the second reference voltage may be set to a different one of: the input-output voltage load, or the drain voltage minus an input-output voltage load. Following 480, the method 400 may proceed to 495 where the method 400 ends.

It should be noted that method 400 may be expanded to include additional steps, or may be modified to replace steps with different steps, to combine steps, to omit steps, to perform steps in a different order, and so forth. For instance, 450-480 may be performed in parallel with 410-440. In one example, the module may repeat one or more steps of the method 400, such as 410-440 and/or 410-480 over subsequent time periods and/or as the number of I/O ports in use may change, as the drive modes of such I/O ports may change, and so forth. In one example, the method 400 may be expanded to include obtaining I/O port utilization information (e.g., I/O type, drive mode, etc.) and selecting the control logic in response thereto. In one example, 430 may include activating multiple first outer ballast stages/transistor chains in response to the first control signal, or multiple respective control signals for the multiple first outer ballast stages. Similarly, 470 may include activating multiple second outer ballast stages/transistor chains in response to the second control signal, or multiple respective control signals for the multiple second outer ballast stages. In one example, the method 400 may include generating and/or obtaining additional control signal(s) or changed value(s) for such control signal(s), and deactivating the first and/or second outer ballast stage in response thereto. In one example, the method 400 may be expanded or modified to include steps, functions, and/or operations, or other features described in connection with the example(s) of FIG. 1-3 or 5-6, or as described elsewhere herein. Thus, these and other modifications are all contemplated within the scope of the present disclosure.

In addition, in one example, the present disclosure may include an apparatus having at least one amplifier loop to generate at least a first bias voltage on an output of the at least one amplifier loop, a first outer ballast stage including a first transistor chain connected to an input-output positive supply voltage rail and to an input-output negative supply voltage rail, where the output of the at least one amplifier loop is connected to at least a first gate of at least a first transistor of the first outer ballast stage, and where at least a second gate of at least a second transistor of the first outer ballast stage is connected to a first control signal to enable and disable the first outer ballast stage. The apparatus may further include a second outer ballast stage having a second transistor chain connected to the input-output positive supply voltage rail and to the input-output negative supply voltage rail, where the output of the at least one amplifier loop is connected to at least a first gate of at least a first transistor of the second outer ballast stage, and where at least a second gate of at least a second transistor of the second outer ballast stage is connected to a second control signal to enable and disable the second outer ballast stage. In addition, the apparatus may include a reference voltage output rail driven by the first outer ballast stage and the second outer ballast stage, where a bias current on the reference voltage output rail is based upon a number of outer ballast stages that are enabled from among at least the first outer ballast stage and the second outer ballast stage.

In one example, the at least one amplifier loop may include a first amplifier having a first input for feedback from a first inner ballast stage including at least a third transistor chain and a second input for an input reference voltage. In one example, the reference voltage output rail may include a first reference voltage output rail, where the apparatus may further include a second reference voltage output rail, and where the first outer ballast stage and the second outer ballast stage are for generating a first output reference voltage (e.g., VREF_P or VREF_N) on the first reference voltage output rail. In addition, in one example, the apparatus may further include at least a third outer ballast stage and a fourth outer ballast stage for generating a second output reference voltage (e.g., a different one of VREF_P or VREF_N) on the second reference voltage output rail. In one example, the first output reference voltage may be set to a positive supply voltage minus an input-output voltage load (Vstress), and the second output reference voltage may be set to the input-output voltage load. In one example, the apparatus may include an input-output stage, where the first output reference voltage and the second output reference voltage are applied to the input-output stage. In one example, the input-output stage may include a Schmitt trigger, where the first outer ballast stage and the second outer ballast stage are for generating a first output reference voltage on the first reference voltage output rail, and where the first output reference voltage is applied to the Schmitt trigger.

In one example, the first transistor chain and the second transistor chain may each include a first p-type transistor connected to the input-output positive supply voltage rail, a second p-type transistor connected to the first p-type transistor, an n-type transistor connected to the second p-type transistor, and a third p-type transistor connected to the n-type transistor and to the input-output negative supply voltage rail. In such an example, the (first) reference voltage output rail may be connected to the first transistor chain at an intermediate position between the second p-type transistor and the n-type transistor (and similarly for the second transistor chain). In addition, in such an example, the at least the first transistor may be the third p-type transistor, the at least the second transistor may be one or both of: the second p-type transistor and the n-type transistor. In addition, a gate of the first p-type transistor may be controlled by a second bias voltage (e.g., VBIAS2_P or VBIAS2_N in the example of FIG. 2) (and similarly for the second transistor chain).

In one example, the first transistor chain and the second transistor chain may each include: a first n-type transistor connected to the input-output positive supply voltage rail, a p-type transistor connected to the first n-type transistor, a second n-type transistor connected to the p-type transistor, and a third n-type transistor connected to the second n-type transistor and to the input-output negative supply voltage rail. In such an example, the (first) reference voltage output rail may be connected to the first transistor chain at an intermediate position between the p-type transistor and the second n-type transistor (and similarly for the second transistor chain). In addition, in such an example, the at least the first transistor may be the first n-type transistor, and the at least the second transistor may be one or both of: the p-type transistor and the second n-type transistor. In addition, a gate of the third n-type transistor may be controlled by a second bias voltage.

In another example, an apparatus may alternatively or additionally include an input-output positive supply voltage rail, an input-output negative supply voltage rail, and a plurality of transistor chains including at least (1) a first transistor chain connected to an input-output positive supply voltage rail and to an input-output negative supply voltage rail and (2) a second transistor chain connected to the input-output positive supply voltage rail and to the input-output negative supply voltage rail. In one example, at least a first gate of at least a first transistor of the first transistor chain may be connected to a first control signal to enable and disable a first current between the input-output positive supply voltage rail and the input-output negative supply voltage rail via the first transistor chain. Similarly, at least a first gate of at least a first transistor of the second transistor chain may be connected to a second control signal to enable and disable a second current between the input-output positive supply voltage rail and the input-output negative supply voltage rail via the second transistor chain. The apparatus may further include a reference voltage output rail driven by the first transistor chain and the second transistor chain, where a bias current on the reference voltage output rail may be based upon a number of transistor chains that are enabled from among the plurality of transistor chains. In one example, the foregoing apparatus(es) may represent a module performing the example method 400 of FIG. 4 and/or may be used in connection with any one or more aspects of the method 400.

Figure 5:
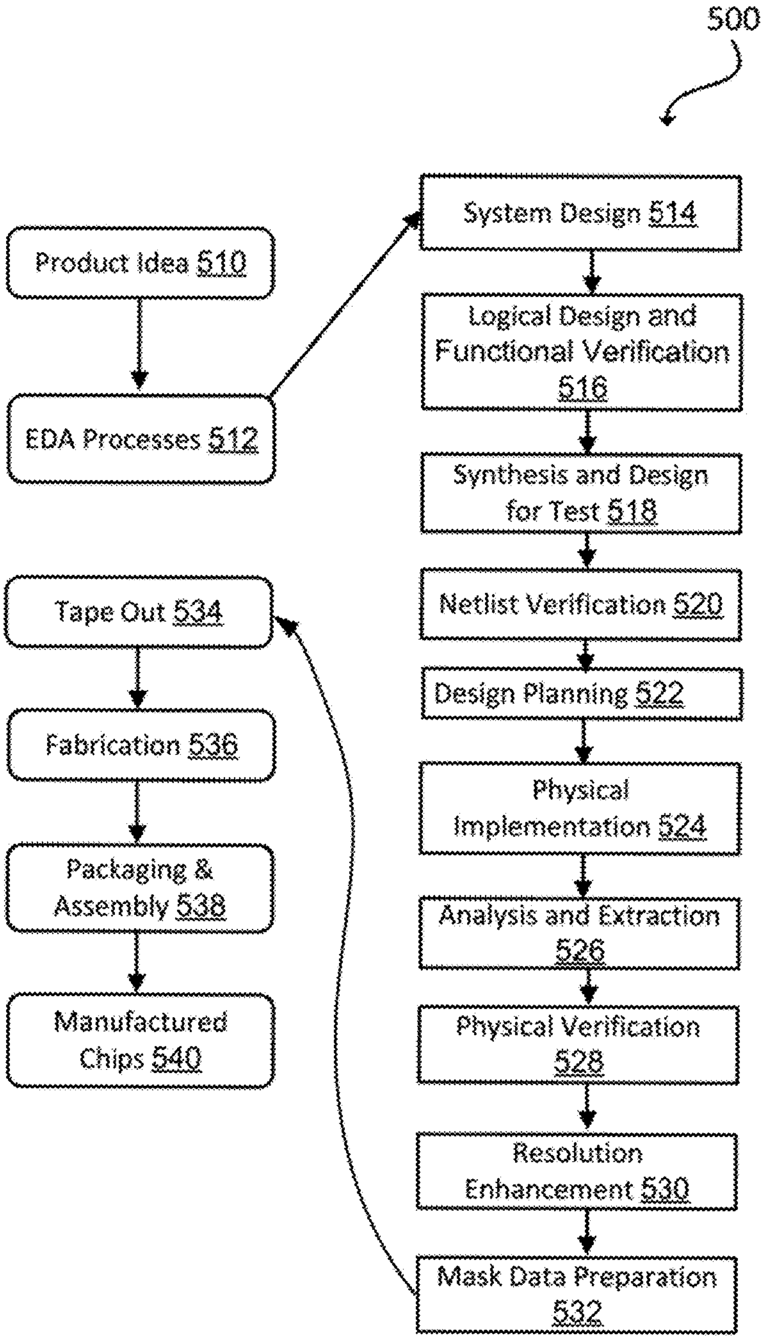
FIG. 5 illustrates a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful details into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 5. The described processes may be enabled by EDA products (or EDA systems).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
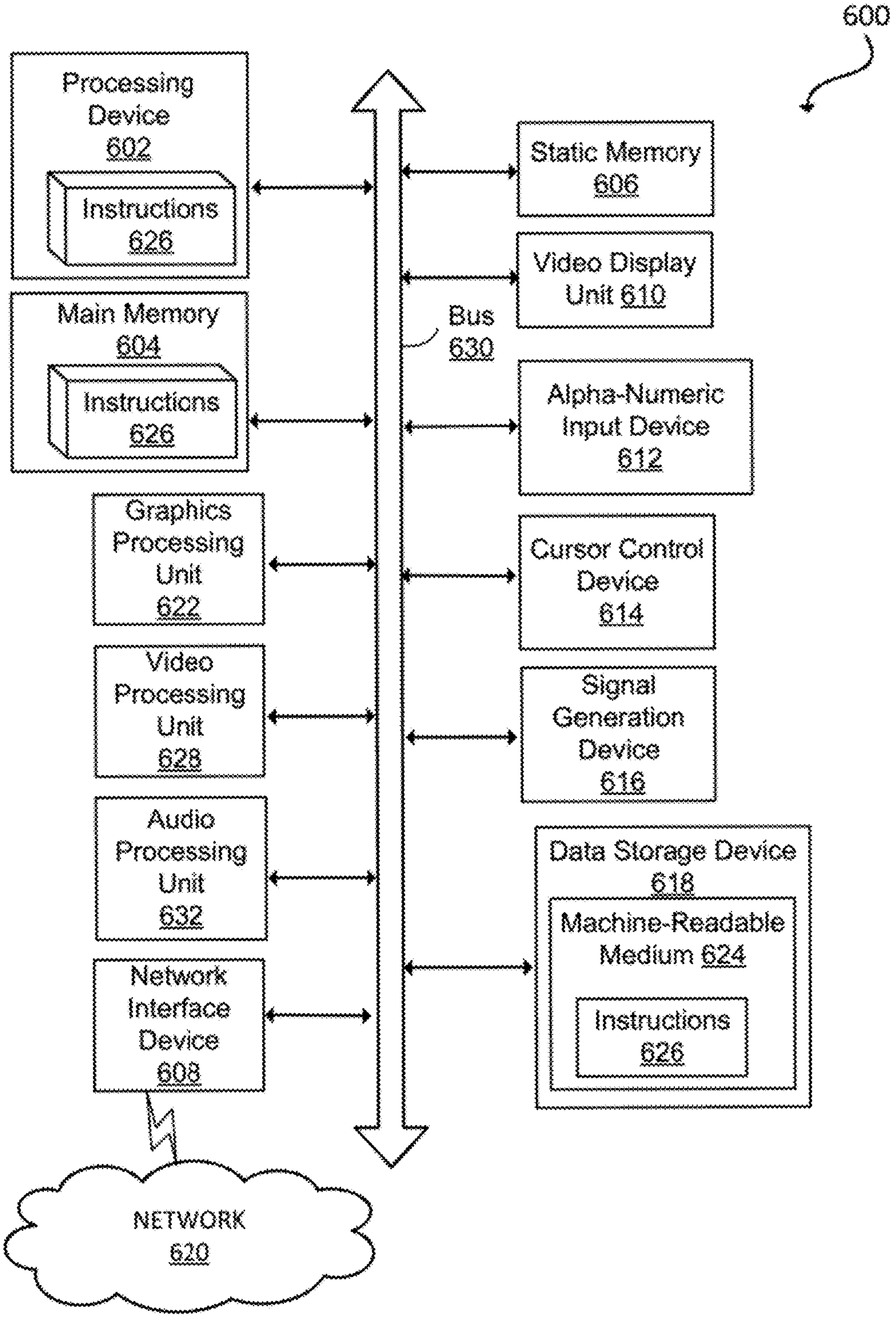
FIG. 6 illustrates a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each connected to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The present disclosure and drawings are, accordingly, to be regarded in an illustrative sense rather than a restrictive sense.

What is claimed is:

1. An apparatus comprising:

at least one amplifier loop to generate at least a first bias voltage on an output of the at least one amplifier loop;

a first outer ballast stage comprising a first transistor chain connected to an input-output positive supply voltage rail and to an input-output negative supply voltage rail, wherein the output of the at least one amplifier loop is connected to at least a first gate of at least a first transistor of the first outer ballast stage, and wherein at least a second gate of at least a second transistor of the first outer ballast stage is connected to a first control signal to enable and disable the first outer ballast stage;

a second outer ballast stage comprising a second transistor chain connected to the input-output positive supply voltage rail and to the input-output negative supply voltage rail, wherein the output of the at least one amplifier loop is connected to at least a first gate of at least a first transistor of the second outer ballast stage, and wherein at least a second gate of at least a second transistor of the second outer ballast stage is connected to a second control signal to enable and disable the second outer ballast stage; and a reference voltage output rail driven by the first outer ballast stage and the second outer ballast stage, wherein a bias current on the reference voltage output rail is based upon a number of outer ballast stages that are enabled from among at least the first outer ballast stage and the second outer ballast stage.

2. The apparatus of claim 1, wherein the at least one amplifier loop includes a first amplifier having a first input for feedback from a first inner ballast stage comprising at least a third transistor chain and a second input for an input reference voltage.

3. The apparatus of claim 1, wherein the at least one amplifier loop comprises a first amplifier loop and a second amplifier loop, wherein the reference voltage output rail comprises a first reference voltage output rail, wherein the apparatus further comprises a second reference voltage output rail, wherein the first outer ballast stage and the second outer ballast stage are for generating a first output reference voltage on the first reference voltage output rail, and wherein at least a third outer ballast stage and a fourth outer ballast stage are for generating a second output reference voltage on the second reference voltage output rail.

4. The apparatus of claim 3, wherein the first output reference voltage is set to a positive supply voltage minus an input-output voltage load, and wherein the second output reference voltage is set to the input-output voltage load.

5. The apparatus of claim 3, further comprising:

an input-output stage, wherein the first output reference voltage and the second output reference voltage are applied to the input-output stage.

6. The apparatus of claim 1, further comprising an input-output stage including a Schmitt trigger, wherein the first outer ballast stage and the second outer ballast stage are for generating a first output reference voltage on the first reference voltage output rail, and wherein the first output reference voltage is applied to the Schmitt trigger.

7. The apparatus of claim 1, wherein the first transistor chain comprises:

a first p-type transistor connected to the input-output positive supply voltage rail;

a second p-type transistor connected to the first p-type transistor;

an n-type transistor connected to the second p-type transistor; and a third p-type transistor connected to the n-type transistor and to the input-output negative supply voltage rail.

8. The apparatus of claim 7, wherein the reference voltage output rail is connected to the first transistor chain at an intermediate position between the second p-type transistor and the n-type transistor.

9. The apparatus of claim 8, wherein the at least the first transistor comprises the third p-type transistor, and wherein the at least the second transistor comprises: the second p-type transistor and the n-type transistor.

10. The apparatus of claim 9, wherein a gate of the first p-type transistor is controlled by a second bias voltage.

11. The apparatus of claim 1, wherein the first transistor chain comprises:

a first n-type transistor connected to the input-output positive supply voltage rail;

a p-type transistor connected to the first n-type transistor;

a second n-type transistor connected to the p-type transistor; and a third n-type transistor connected to the second n-type transistor and to the input-output negative supply voltage rail.

12. The apparatus of claim 11, wherein the reference voltage output rail is connected to the first transistor chain and the second transistor chain at an intermediate position between the p-type transistor and the second n-type transistor.

13. The apparatus of claim 12, wherein the at least the first transistor comprises the first n-type transistor, and wherein the at least the second transistor comprises: the p-type transistor and the second n-type transistor.

14. The apparatus of claim 13, wherein a gate of the third n-type transistor is controlled by a second bias voltage.

15. An apparatus comprising:

an input-output positive supply voltage rail;

an input-output negative supply voltage rail;

a plurality of transistor chains comprising at least:

a first transistor chain connected to the input-output positive supply voltage rail and to the input-output negative supply voltage rail, wherein at least a first gate of at least a first transistor of the first transistor chain is connected to a first control signal to enable and disable a first current between the input-output positive supply voltage rail and the input-output negative supply voltage rail via the first transistor chain;

a second transistor chain connected to the input-output positive supply voltage rail and to the input-output negative supply voltage rail, wherein at least a first gate of at least a first transistor of the second transistor chain is connected to a second control signal to enable and disable a second current between the input-output positive supply voltage rail and the input-output negative supply voltage rail via the second transistor chain; and a reference voltage output rail driven by the first transistor chain and the second transistor chain, wherein a bias current on the reference voltage output rail is based upon a number of transistor chains that are enabled from among the plurality of transistor chains.

16. A method for generating a reference voltage for an input-output ring of an integrated circuit, comprising:

applying an output of a first amplifier loop to at least a first gate of at least a first transistor of a first outer ballast stage of the integrated circuit, the first outer ballast stage comprising a first transistor chain connected to an input-output positive supply voltage rail and to an input-output negative supply voltage rail;

receiving a first control signal associated with a first bias current for a first reference voltage;

activating, in accordance with the first control signal, the first outer ballast stage of the integrated circuit, wherein at least a second gate of at least a second transistor of the first outer ballast stage is connected to the first control signal to enable and disable the first outer ballast stage, wherein the first bias current for the first reference voltage is dependent upon a number of outer ballast stages that are activated from among a first plurality of outer ballast stages, where the first plurality of outer ballast stages includes the first outer ballast stage, wherein the first reference voltage is generated via at least the first outer ballast stage when activated; and applying the first reference voltage with the first bias current to an input-output stage of the integrated circuit.

17. The method of claim 16, wherein at least the first control signal is output via a control logic that selects the number of outer ballast stages that are activated from among the first plurality of outer ballast stages based upon at least one of:

a drive mode of at least one input-output port of the input-output stage; or or a number of input-output ports of the input-output stage that are toggling.

18. The method of claim 16, wherein the input-output stage comprises:

an input-output ring of the integrated circuit; or an input-output module.

19. The method of claim 16, wherein the input-output stage comprises at least one input-output port, wherein the at least one input-output port is for at least one of:

a general-purpose input-output communication bus;

an inter-integrated circuit communication bus;

an improved inter-integrated circuit communication bus;

a secure digital input-output communication bus; or a serial peripheral interface communication bus.

20. The method of claim 16, further comprising:

applying an output of a second amplifier loop to at least a first gate of at least a first transistor of a second outer ballast stage of the integrated circuit, the second outer ballast stage comprising a second transistor chain connected to the input-output positive supply voltage rail and to the input-output negative supply voltage rail;

receiving a second control signal associated with a second bias current for a second reference voltage;

activating, in accordance with the second control signal, the second outer ballast stage of the integrated circuit, wherein at least a second gate of at least a second transistor of the second outer ballast stage is connected to the second control signal to enable and disable the second outer ballast stage, wherein the second bias current for the second reference voltage is dependent upon a number of outer ballast stages that are activated from among a second plurality of outer ballast stages, where the second plurality of outer ballast stages includes the second outer ballast stage; and applying the second reference voltage with the second bias current to the input-output stage of the integrated circuit.

* * * * *